(12) United States Patent
Sanada (10) Patent No.: US 12,339,716 B2
(45) Date of Patent: Jun. 24, 2025

(54) INFORMATION PROCESSING APPARATUS

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 247 days.

(21) Appl. No.: 18/326,036

(22) Filed: May 31, 2023

(65) Prior Publication Data

US 2024/0201760 A1 Jun. 20, 2024

(30) Foreign Application Priority Data

Dec. 20, 2022 (JP) ................................. 2022-202939

(51) Int. Cl.
*G06F 1/20* (2006.01)
*G06F 1/26* (2006.01)
*H05K 7/20* (2006.01)

(52) U.S. Cl.
CPC .................. *G06F 1/20* (2013.01); *G06F 1/26* (2013.01); *H05K 7/20136* (2013.01)

(58) Field of Classification Search
None
See application file for complete search history.

(56) References Cited

U.S. PATENT DOCUMENTS

| | | | | |
|---|---|---|---|---|
| 6,272,007 B1 * | 8/2001 | Kitlas | ..................... | G06F 1/185 361/725 |
| 6,661,656 B2 * | 12/2003 | Kim | ........................ | G06F 1/181 361/615 |
| 6,741,475 B1 * | 5/2004 | Chuang | ................. | G06F 1/1616 174/16.3 |
| 2021/0248099 A1 | 8/2021 | Hasegawa | | |

* cited by examiner

*Primary Examiner* — Mukundbhai G Patel
(74) *Attorney, Agent, or Firm* — Amin, Turocy & Watson, LLP (57) ABSTRACT

An information processing apparatus includes: a housing including a front surface portion and a back surface portion; one or more input and output terminals provided on the back surface portion to allow connection to an external device; an accommodation portion provided in the housing and configured to removably accommodate a power supply adapter, the power supply adapter including a primary-side cable connectable to a commercial power supply and a secondary-side cable to supply electric power; a connector that is provided in the accommodation portion and that is connectable to the secondary-side cable of the power supply adapter accommodated in the accommodation portion; a circuit portion to perform various processes upon receiving supply of electric power from the power supply adapter whose secondary-side cable is connected to the connector; and a hole formed in the housing to lead the primary-side cable of the power supply adapter to outside of the housing.

16 Claims, 9 Drawing Sheets

INFORMATION PROCESSING APPARATUS

CROSS-REFERENCE TO RELATED APPLICATION

This application is based upon and claims the benefit of priority from Japanese Patent Application No. 2022-202939, filed on Dec. 20, 2022, the entire contents of which are incorporated herein by reference.

FIELD

Embodiments described herein relate generally to an information processing apparatus.

BACKGROUND

For example, in an information processing apparatus such as a POS terminal or a desktop-type personal computer, an HDD or a DVD player, which is provided in related art, is not provided in recent years due to development and size reduction of a memory device, and accordingly, an housing of the information processing apparatus is thinned and reduced in size (hereinafter, referred to as "size reduction").

In an information processing apparatus in related art that is equipped with an HDD, a DVD player, or the like, since there is a sufficient space on a back surface of a housing, various input and output terminals (hereinafter also referred to as "I/O terminals (I/O ports)") including a terminal of a power supply adapter (also referred to as an AC adapter) can be disposed on the back surface. However, on the above-described information processing apparatus that is reduced in size, since a space on a back surface thereof is narrowed, it is difficult to dispose the I/O terminal as in the related art.

DETAILED DESCRIPTION

In general, according to one embodiment, an information processing apparatus capable of disposing, on a back surface thereof, a necessary I/O terminal is provided.

An information processing apparatus according to an embodiment includes: a housing including a front surface portion and a back surface portion; one or more input and output terminals provided on the back surface portion and configured to allow connection to an external device; an accommodation portion provided in the housing and configured to removably accommodate a power supply adapter, the power supply adapter including a primary-side cable connectable to a commercial power supply and a secondary-side cable configured to supply electric power; a connector that is provided in the accommodation portion and that is connectable to the secondary-side cable of the power supply adapter accommodated in the accommodation portion; a circuit portion configured to perform various processes upon receiving supply of electric power from the power supply adapter whose secondary-side cable is connected to the connector; and a hole formed in the housing and configured to lead the primary-side cable of the power supply adapter to outside of the housing.

Hereinafter, an embodiment of an information processing apparatus will be described with reference to the accompanying drawings. In the embodiment, a POS terminal is described as an example of the information processing apparatus. The embodiment described below is an embodiment of the information processing apparatus, and the information processing apparatus is not limited thereto.

Figure 1:
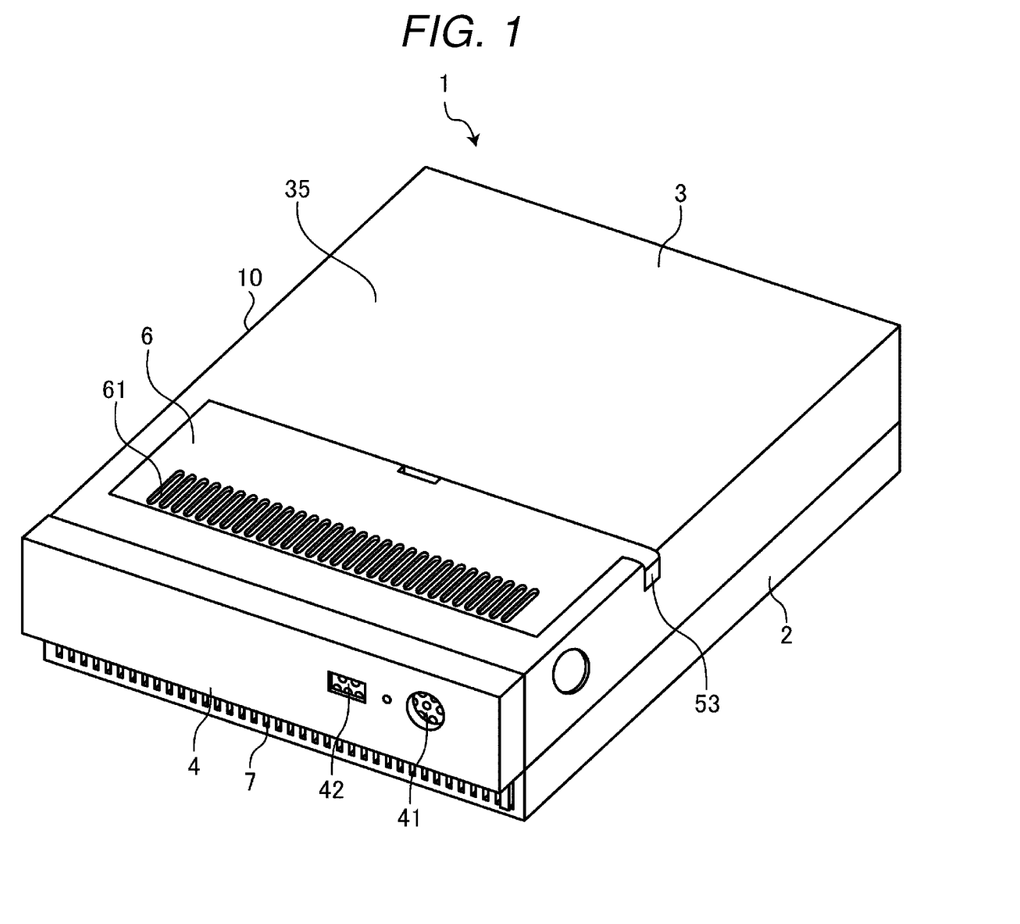
FIG. 1 is a perspective view illustrating an appearance of a POS terminal according to an embodiment.

FIG. 1 is a perspective view illustrating an appearance of a POS terminal 1 according to the embodiment. As illustrated in FIG. 1, the POS terminal 1 includes a substantially rectangular hollow housing 10. The housing 10 includes a main body 2 and a cover 3. The main body 2 is a part of the housing 10 for fixing various devices, components, circuits, and the like of the POS terminal 1 to the housing 10. The main body 2 fixes a fan 8, a motherboard 31, and the like inside the housing 10.

The fan 8 generates a flow of air by rotation of built-in blades. The fan 8 is rotated to generate a flow of air, thereby cooling a circuit, a power supply adapter 21 (see FIG. 3), and the like to be described later. In addition, the main body 2 fixes an accommodation portion 5 inside the housing 10. The motherboard 31 includes a circuit (a central processing unit (CPU) that is an example of a processor) 91 for driving the POS terminal 1, a memory 33 such as a read-only memory (ROM) or a random access memory (RAM), a solid state drive (SSD) 32, and the like (see FIG. 8). The CPU 91, the memory 33, the SSD 32, and the like are collectively referred to as a circuit portion. When electric power is supplied, the circuit portion performs various processes corresponding to each circuit. For example, upon receiving supply of electric power, the CPU 91 executes various processes based on stored software. Upon receiving supply of electric power, the memory 33 and the SSD 32 store information.

The SSD is mounted with a memory chip having a large memory capacity, can read and write data in the same manner as an HDD, and stores a program for operating the POS terminal. With development of the SSD, the SSD is used to replace the HDD.

The main body 2 includes a front surface portion 4 and a back surface portion 11 (that is, the housing 10 includes the front surface portion 4 and the back surface portion 11). The front surface portion 4 is a front surface of the POS terminal 1 and is provided with a power supply switch 41 that is operated by an operator to turn on and off power supply of the POS terminal 1, and a universal serial bus (USB) terminal 42. The USB terminal 42 is a terminal used for connection to an external device and is particularly used if insertion and removal are increased.

The back surface portion 11 is a rear surface of the POS terminal 1 and is located on a side opposite to the front surface portion 4. The back surface portion 11 is provided with an I/O terminal 12, a USB terminal 13, and the like for connecting an external device to the POS terminal 1. A configuration of the back surface portion 11 will be described later with reference to FIG. 7.

The accommodation portion 5 (see FIG. 2) that accommodates the power supply adapter 21 is fixedly provided in the main body 2. The accommodation portion 5 has a substantially quadrangular box shape surrounded by a concave wall surface 511 whose upper side is opened. The accommodation portion 5 has a depth sufficient to accommodate the power supply adapter 21 up to an upper surface thereof if the power supply adapter 21 is accommodated.

The cover 3 has a substantially U shape and is detachably attached to the main body 2 from above. The cover 3 includes a substantially quadrangular opening 36 in an upper surface portion 35. The opening 36 is formed at a position facing the accommodation portion 5 if the cover 3 is attached to the main body 2. A lid 6 is fitted into the opening 36. The lid 6 is attachable to and detachable from the cover 3. The lid 6 is removed from the cover 3 to accommodate the power supply adapter 21 in the accommodation portion 5. Thereafter, the lid 6 is closed. In addition, the lid 6 is removed from the cover 3 to remove the power supply adapter 21 from the accommodation portion 5.

In the lid 6, a plurality of slit-shaped air holes 61 (see FIG. 5) are formed in parallel in a width direction of the POS terminal 1. Each air hole 61 is a hole penetrating the lid 6. The air hole 61 is provided at a position close to the front surface portion 4 in an upper surface (on an upper surface portion 35 side of the cover 3) of the POS terminal 1 in a state in which the lid 6 is mounted on the cover 3. The air hole 61 introduces external air from the upper surface of the POS terminal 1 into the inside of the housing 10.

A large number of air holes 7 are formed such that a plurality of the air holes 7 are arranged in the front surface portion 4 vertically and horizontally. Each air hole 7 is a hole penetrating the front surface portion 4. The air hole 7 introduces external air into the inside of the housing 10.

Figure 2:
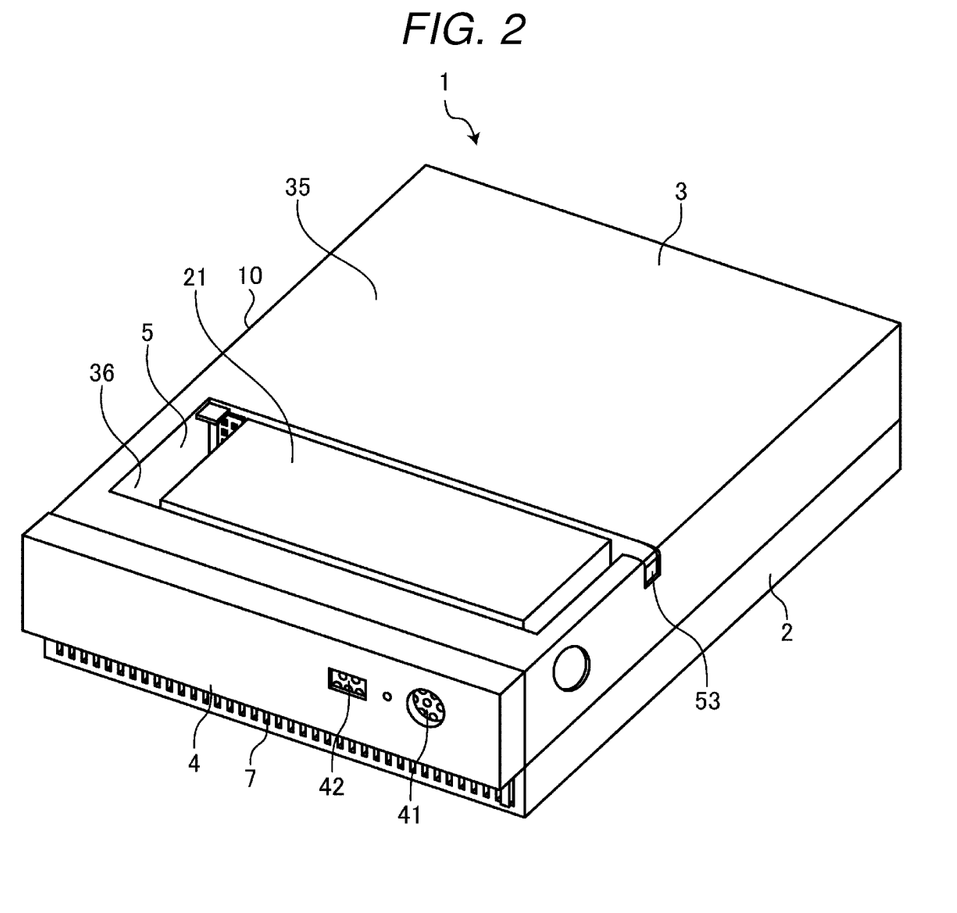
FIG. 2 is a perspective view in which a lid is removed.

FIG. 2 is a perspective view illustrating a state in which the lid 6 is removed from the cover 3 of the POS terminal 1 and the power supply adapter 21 is accommodated in the accommodation portion 5. In this state, the upper surface of the power supply adapter 21 is located slightly lower than the upper surface portion 35, and if the lid 6 is attached to the cover 3, the lid 6 is substantially flush with the upper surface portion 35.

Figure 3:
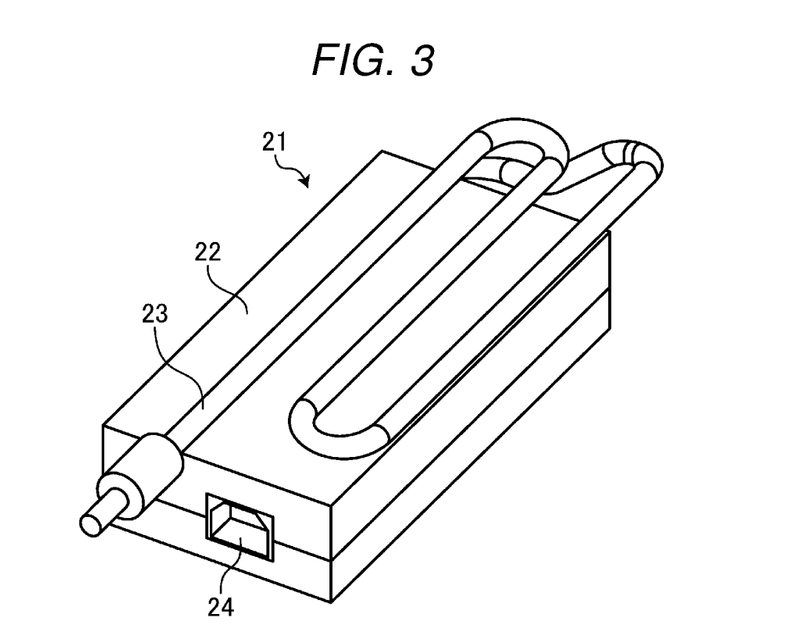
FIG. 3 is a perspective view illustrating a power supply adapter.
Figure 7:
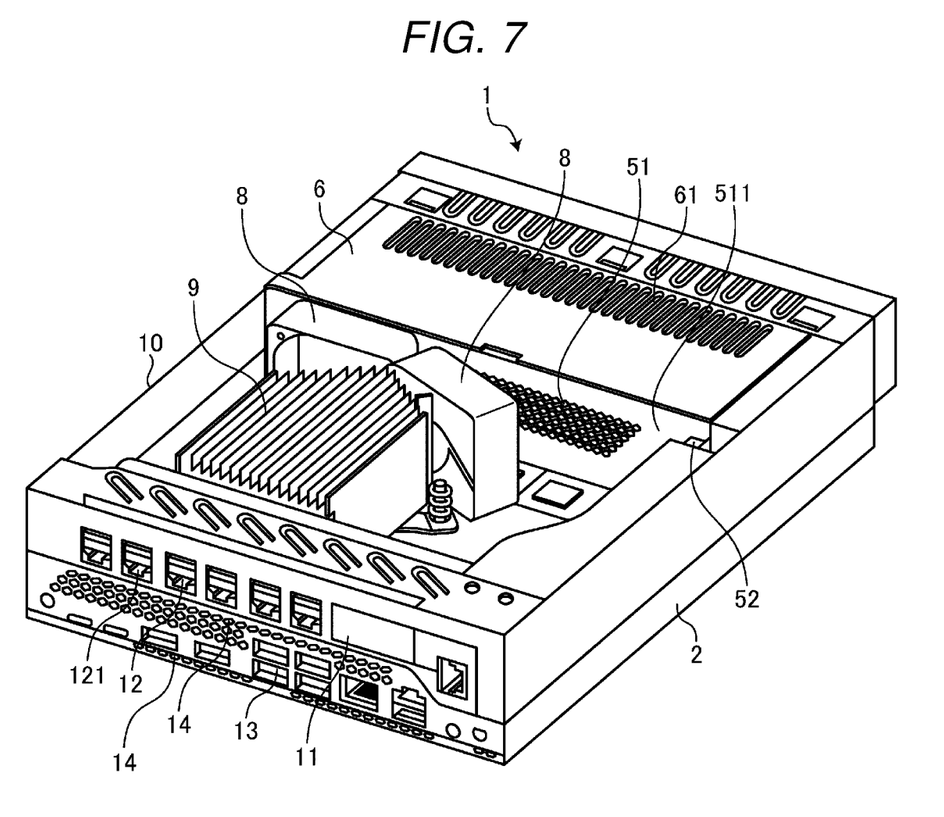
FIG. 7 is a perspective view illustrating the appearance as viewed from the rear in the state in which the cover is removed.
Figure 9:
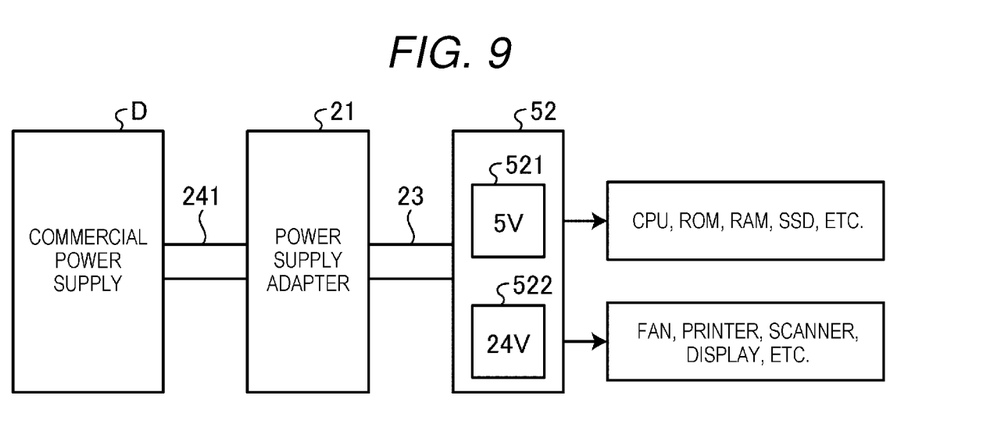
FIG. 9 is an explanatory diagram illustrating a state of power supply from the power supply adapter.

In FIG. 2, a hole 53, which will be described later in FIGS. 3 and 9, is a hole for leading out a primary-side cable 241 of the power supply adapter 21 accommodated in the accommodation portion 5 from the inside to the outside of the housing 10. It is desirable that the hole 53 is formed in a surface other than the back surface portion 11 of the housing 10 on which the I/O terminal 12, the USB terminal 13, and the like to be described later with reference to FIG. 7 are mounted. In the embodiment, the hole 53 is formed in a surface other than the front surface portion 4 and the back surface portion 11. For example, in the embodiment, the hole 53 is formed in a side surface other than the front surface portion 4 and the back surface portion 11 in a manner of not interfering with the POS terminal 1 regardless of whether the POS terminal 1 is placed horizontally or vertically.

In FIG. 2, the accommodation portion 5 is located at a position close to the front surface portion 4 (on a front surface portion 4 side) in the housing 10. A POS terminal in related art (not illustrated) includes, in a housing thereof, a DVD player or a hard disk drive (HDD), and in particular, the DVD player is disposed on the front surface portion 4 side in the housing so as to be operable from the front. However, in recent years, the DVD player is not essential due to an increase in a memory capacity and development of the SSD, and thus a large number of POS terminals are not mounted with the DVD player. In the POS terminal 1 according to the embodiment, by utilizing such a space where the DVD player or the HDD is not mounted, the accommodation portion 5 is disposed at the position close to the front surface portion 4 of the housing 10. In such a POS terminal 1, the power supply adapter 21 is accommodated at a position close to the front surface portion 4 in the housing 10.

Next, the power supply adapter 21 will be described. FIG. 3 is a perspective view illustrating the power supply adapter 21. As illustrated in FIG. 3, the power supply adapter 21 includes a main body 22, the primary-side cable 241 (see FIG. 9), and a secondary-side cable 23. The primary-side cable 241 is electrically connected to the main body 22 by being inserted into a connector 24 of the main body 22. The primary-side cable 241 includes a plug (not illustrated) and is supplied with electric power (for example, 100 V) from a commercial power supply D (see FIG. 9) by inserting the plug into the commercial power supply D. The main body 22 converts a voltage (alternating current (AC)) supplied from the commercial power supply D into a direct current (DC). The main body 22 includes, for example, a circuit that generates a plurality of types (levels) of DC voltages (for example, 5V and 24V) from the electric power supplied from the commercial power supply D. The main body 22 supplies the generated electric power of the plurality of types of voltages to the secondary-side cable 23. The secondary-side cable 23 includes a plurality of (for example, six) electric wires therein, and supplies, for example, electric power having a voltage of 5 V and a voltage of 24 V through different electric wires. That is, the power supply adapter 21 converts the AC voltage supplied from the commercial power supply D into a plurality of levels of DC voltages.

Such a power supply adapter 21 is commercially available. The main body 22 is generally formed of a resin or plastic case and includes a circuit therein. The main body 22 generates heat if a DC voltage is generated from the commercial power supply D. Such a main body 22 is designed such that, if used in a normal state (for example, if the main body 22 is placed outside the information processing apparatus for use), heat is naturally dissipated from the case to the outside and the main body 22 can be used without problems.

Figure 4:
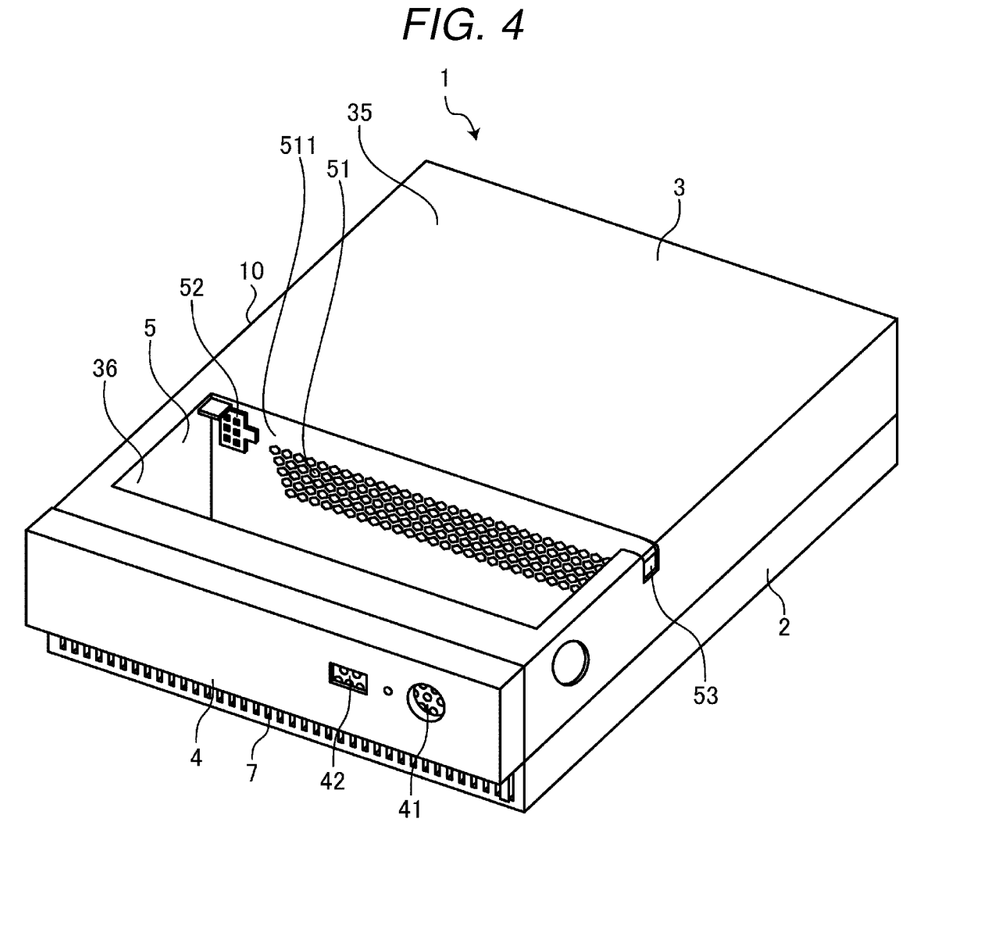
FIG. 4 is a perspective view illustrating the appearance in a state in which the power supply adapter is removed.

FIG. 4 is a perspective view illustrating the appearance of the POS terminal 1 in a state in which the power supply adapter 21 is further removed from the state in FIG. 2. As illustrated in FIG. 4, the wall surface 511 separates the accommodation portion 5 from other elements (for example, the circuit portion) of the POS terminal 1. That is, the accommodation portion 5 is a concave area in which the power supply adapter 21 (the main body 22, the secondary-side cable 23, and the primary-side cable 241) is accommodated. In addition, a large number of holes 51 are formed in the wall surface 511. Although not illustrated in FIG. 4, a large number of holes 51 are also formed (see FIG. 8) in the wall surface 511 on a near side (on the front surface portion 4 side). Each hole 51 penetrates the accommodation portion 5 and the other part of the inside of the housing 10. In other words, air in the accommodation portion 5 and other air in the housing 10 can flow through the hole 51.

Figure 5:
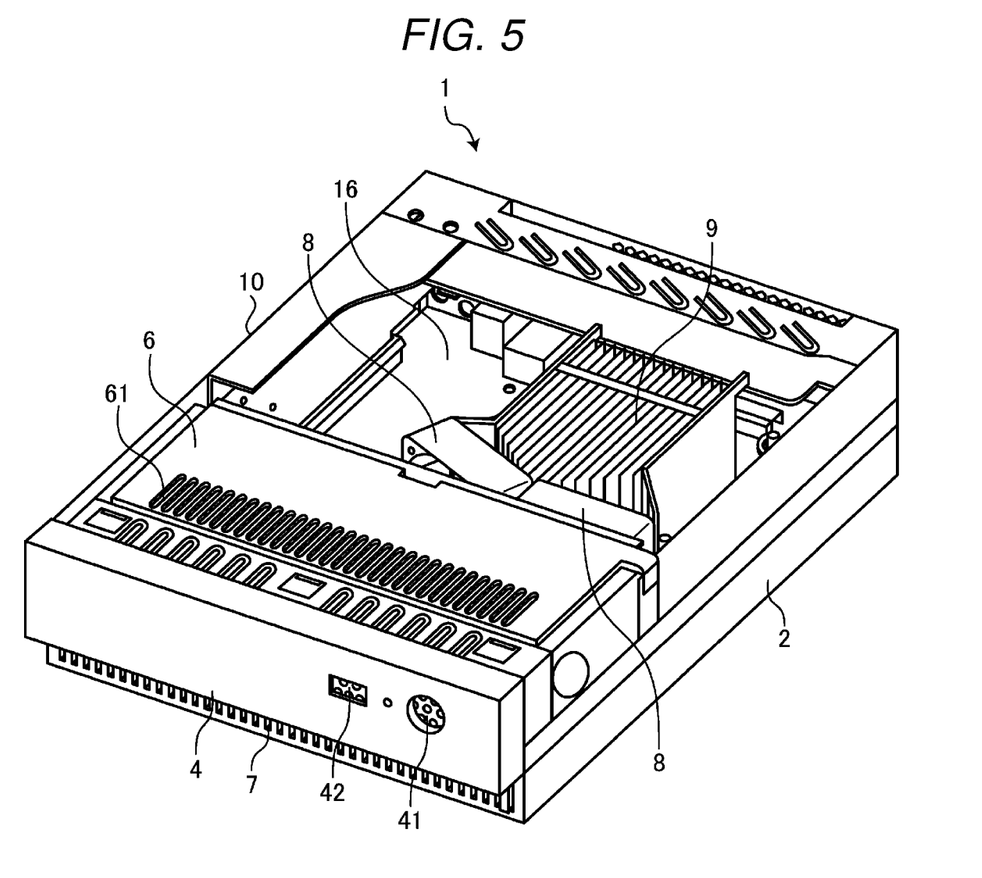
FIG. 5 is a perspective view illustrating the appearance in a state in which a cover is removed.

FIG. 5 is a diagram illustrating a state in which the cover 3 is removed from the housing 10 illustrated in FIG. 1 (a state in which the inside of the housing 10 of the POS terminal 1 is visible). As illustrated in FIG. 5, a heat sink plate (a heat sink) 9 is provided in the housing 10. The heat sink plate 9 is fixed to the main body 2 or the motherboard

31. The heat sink plate 9 is a member having a large surface area made of a metal having high thermal conductivity, such as aluminum, and is provided in contact with the circuit portion such as the CPU 91. The heat sink plate 9 dissipates, from a surface thereof to the outside, heat generated from the circuit portion so as to prevent the circuit portion from being overheated (cool the circuit portion). In the embodiment, the heat sink plate 9 dissipates heat generated by the CPU 91. The heat sink plate 9 is located closer to the back surface portion 11 than is the accommodation portion 5.

In the POS terminal 1, the fans 8 (two fans 8 in the embodiment as an example) are provided in the housing 10. Each fan 8 is fixed to the main body 2 or the motherboard 31. The fan 8 is provided between the accommodation portion 5 and the heat sink plate 9.

The fan 8 includes a plurality of blades and generates a flow of air (airflow) by rotation of the blades. By rotating the blades, the fan 8 generates a flow of air from a side where the accommodation portion 5 is located toward the heat sink plate 9. In the embodiment, by disposing the two fans 8 at different angles with respect to the main body 2 with a vertical direction as an axis, the flow of air is concentrated from a wide range of positions in the accommodation portion 5 toward the heat sink plate 9.

Figure 6:
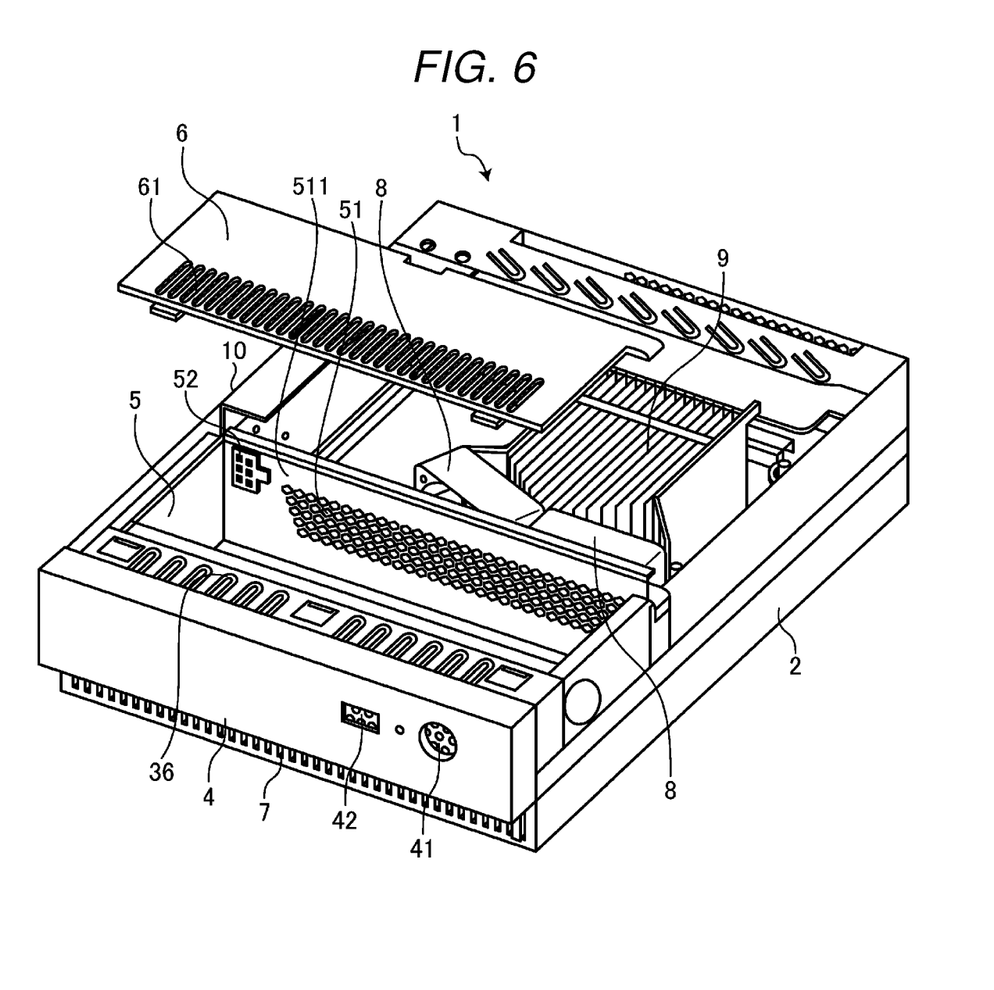
FIG. 6 is a perspective view illustrating the appearance in a state in which the lid and the cover are removed.

FIG. 6 illustrates the POS terminal 1 in a state in which the lid 6 is removed from the POS terminal 1 in FIG. 5. As illustrated in FIG. 6, a large number of holes 51 are formed in the wall surface 511 in a width direction (a left-right direction in FIG. 6) of the wall surface 511. The two fans 8 are disposed along the wall surface 511 in a manner of being close to (or adjacent to) the wall surface 511. That is, the two fans 8 are disposed along the holes 51 in a manner of being close to (or adjacent to) the holes 51. Therefore, if the two fans 8 rotate (the blades rotate), a flow of air is generated, and air in the accommodation portion 5 is suctioned out from the holes 51 and led out of the accommodation portion 5. That is, the two fans 8 are located downstream of the accommodation portion 5 in an air flow direction.

The two fans 8 are disposed close to (or adjacent to) the heat sink plate 9. Therefore, if the two fans 8 rotate (the blades rotate), air is blown out toward the heat sink plate 9. The heat sink plate 9 is cooled by the air blown out from the fans 8. That is, heat dissipated from the heat sink plate 9 is led out to the outside by the airflow blown out from the fans 8, so that the heat sink plate 9 is cooled. If the heat sink plate 9 is cooled, the CPU 91 connected to the heat sink plate 9 is cooled. That is, the heat sink plate 9 is located downstream of the two fans 8 in the air flow direction.

Here, the accommodation portion 5 includes a connector 52 on the wall surface 511 on a side close to the fan 8. That is, the POS terminal 1 includes the connector 52 in the accommodation portion 5 provided inside the housing 10. The secondary-side cable 23 of the power supply adapter 21 is connected to the connector 52. The connector 52 includes a plurality of pins (for example, six pins). The connector 52 is electrically connected to various components provided in the housing 10. The connector 52 is electrically connected to the circuit portion such as the CPU 91, the SSD 32, and the memory 33 that are fixed to the motherboard 31. The connector 52 supplies, for example, electric power having a voltage of 5 V to the connected circuit. In addition, the connector 52 is electrically connected to the fan 8. The connector 52 supplies, for example, electric power having a voltage of 24 V to the connected fan 8. In addition, the connector 52 supplies, via the I/O terminal 12 (see FIG. 7) to be described later, electric power having a voltage of 24 V to a device connected to the I/O terminal 12.

FIG. 7 is a perspective view of the POS terminal 1 in the state in FIG. 5 as viewed obliquely from the rear. As illustrated in FIG. 7, an I/O port 121, in which a plurality of (six in the embodiment) I/O terminals 12 are arranged in a line, is formed on the back surface portion 11 of the housing 10. Various devices connected to the POS terminal 1 are connected to the I/O terminals 12. Each I/O terminal 12 is connected to a device, such as a receipt printer, a display, a card reader and writer, or a settlement terminal (all not illustrated), which is normally not removed (always connected) once connected.

One or more (four in the embodiment) USB terminals 13 are provided on the back surface portion 11 of the housing 10. For example, a mouse for operating a pointer displayed on a display and a USB memory are connected to the USB terminals 13.

Here, in the embodiment, a power supply terminal for connection to the power supply adapter 21 is not provided on the back surface portion 11 of the housing 10. In the embodiment, the connector 52 corresponding to the power supply terminal is provided in the accommodation portion 5 (that is, inside the housing 10). Since no HDD or DVD player is mounted on the recent POS terminal 1, a size and a thickness of the housing 10 of the POS terminal 1 tend to be reduced. Therefore, an area occupied by the front surface portion 4 and the back surface portion 11 is small. For this reason, the accommodation portion 5 that accommodates the power supply adapter 21 is provided inside the housing 10 using a space created since no HDD or DVD player is mounted. In the embodiment, the connector 52 corresponding to the power supply terminal disposed on the back surface portion 11 in the related art is disposed at the position of the accommodation portion 5 inside the housing 10. In this embodiment, since the power supply terminal is removed from the back surface portion 11, a necessary number of I/O terminals 12 can be disposed on the back surface portion 11.

In the embodiment, since the thickness of the housing 10 is reduced, the I/O terminals 12 that are arranged in two rows in the related art are arranged in one row. Therefore, the number of I/O terminals 12 on the back surface portion 11 may be reduced as compared with a POS terminal in the related art. However, in the POS terminal 1 according to the embodiment, since the size and the thickness of the housing 10 are reduced, a degree of freedom in installation of the POS terminal 1 is improved as compared to the POS terminal in the related art. For example, the POS terminal 1 which is reduced in size according to the embodiment can be provided vertically in a small gap such as behind a display. In addition, it is also possible to lay the POS terminal 1 flat in a minute space. That is, the POS terminal 1 can be provided in an inconspicuous place. For this reason, even if the missing I/O terminals 12 and USB terminals 13 are disposed on the front surface portion 4, it is possible to provide expandability without paying attention to the appearance of the POS terminal 1.

Figure 8:
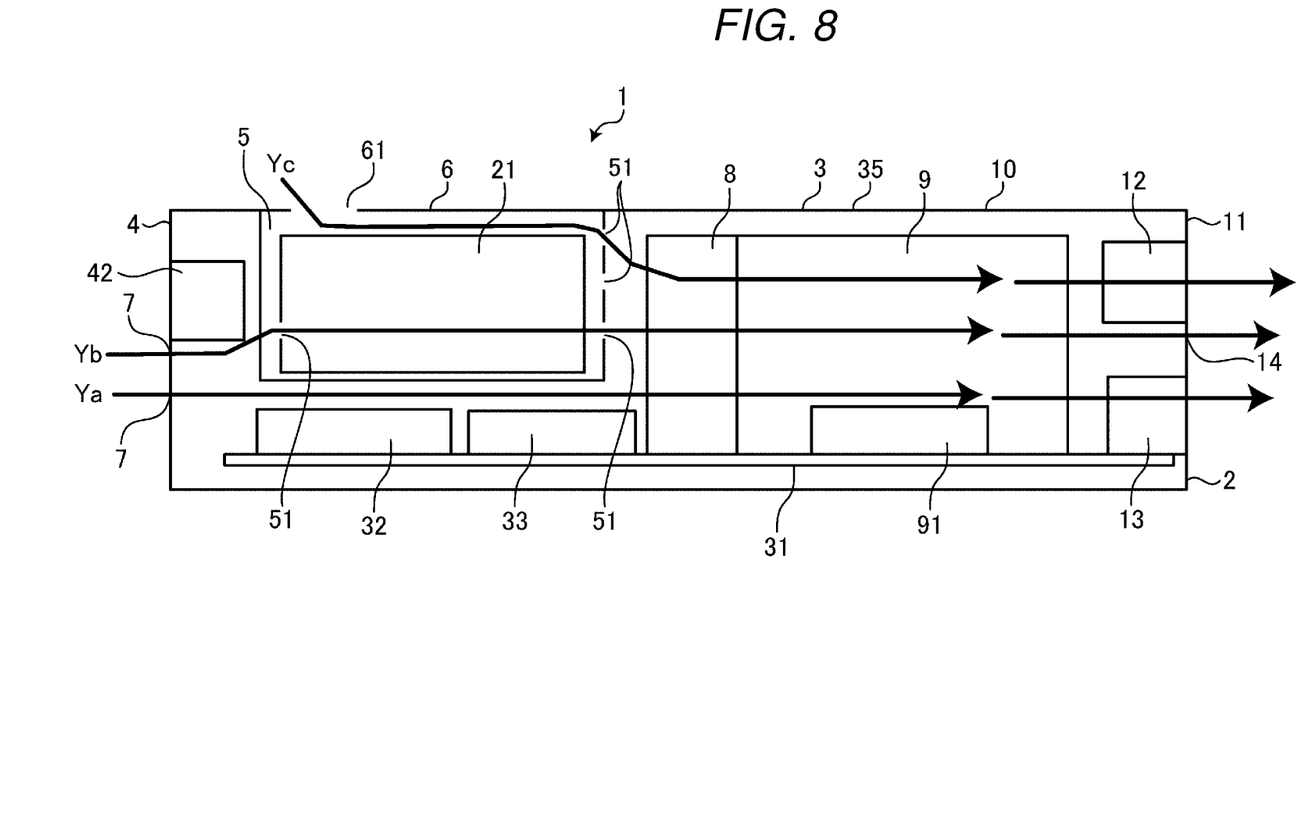
FIG. 8 is an explanatory diagram illustrating an internal structure of the POS terminal and a flow of air.

Hereinafter, in the POS terminal 1, a flow of air (airflow) inside the housing 10 caused by rotation of the fan 8 will be described. FIG. 8 is an explanatory diagram illustrating an internal structure of the POS terminal 1 and the flow of air if the fan 8 rotates, as viewed laterally inside the POS terminal 1. As illustrated in FIG. 8, the accommodation portion 5 is disposed close to the front surface portion 4 inside the housing 10, and the USB terminal 42, the accommodation portion 5, the fan 8, the heat sink plate 9 (including the CPU 91), the I/O terminal 12, and the USB terminal 13 are disposed in this order in the POS terminal 1 from the front toward the back surface portion 11 (from the left to the right in FIG. 8). In addition, the SSD 32 and the memory 33 are disposed below the accommodation portion 5.

In the POS terminal 1 according to the embodiment, if the fan 8 rotates, flows of air are generated mainly in three directions along an airflow path Ya, an airflow path Yb, and an airflow path Yc. The airflow path Ya is a flow of air along which air flowing into the housing 10 from the air hole 7 passes between the accommodation portion 5, and the SSD 32 and the memory 33, passes through the fan 8 and the heat sink plate 9, and flows out to the outside from a hole 14 and a gap between the USB terminals 13. The air flowing through the airflow path Ya removes heat generated by the SSD 32, the memory 33, and the heat sink plate 9, and thus cools the SSD 32, the memory 33, and the heat sink plate 9.

The airflow path Yb is a flow of air along which air flowing into the housing 10 from the air hole 7 flows into the accommodation portion 5 from the hole 51, flows out from the hole 51 on an opposite side (that is, passes through the accommodation portion 5), passes through the fan 8 and the heat sink plate 9, and flows out to the outside from the hole 14 and gaps between the USB terminals 13 and the I/O terminals 12. The air flowing through the airflow path Yb removes heat generated by the power supply adapter 21 and the heat sink plate 9 that are accommodated in the accommodation portion 5, and thus cools the power supply adapter 21 and the heat sink plate 9. As described above, since the power supply adapter 21 (the main body 22) is accommodated in the accommodation portion 5, heat dissipated from the case of the main body 22 may remain in the accommodation portion 5. If the air flowing through the airflow path Yb passes through the inside of the accommodation portion 5, the heat generated by the main body 22 can be dissipated from the accommodation portion 5 to the outside of the housing 10.

The airflow path Yc is a flow of air along which air flowing into the housing 10 from the air hole 61 flows into the accommodation portion 5, flows out from the hole 51 (that is, passes through the accommodation portion 5), passes through the fan 8 and the heat sink plate 9, and flows out to the outside from the hole 14 and the gaps between the USB terminals 13 and the I/O terminals 12. The air flowing through the airflow path Yc removes heat generated by the power supply adapter 21 and the heat sink plate 9 that are accommodated in the accommodation portion 5, and thus cools the power supply adapter 21 and the heat sink plate 9.

In this way, by disposing the fan 8 between the accommodation portion 5 and the heat sink plate 9 and generating the flows of air along the airflow path Ya, the airflow path Yb, and the airflow path Yc, it is possible to cool the circuit and the heat sink plate 9 and to cool the power supply adapter 21 even if the power supply adapter 21 (the main body 22) that is originally placed outside is accommodated in the accommodation portion 5. In particular, since the accommodation portion 5 is disposed close to the front surface portion 4, the power supply adapter 21 accommodated in the accommodation portion 5 can be efficiently cooled by air introduced from the outside of the housing 10.

Hereinafter, in the POS terminal 1 according to the embodiment, electric power supplied to each portion by the power supply adapter 21 will be described. FIG. 9 is an explanatory diagram illustrating a state of power supply from the power supply adapter 21 to the POS terminal 1 in a state in which the primary-side cable 241 of the power supply adapter 21 is connected to the commercial power supply D and the secondary-side cable 23 is connected to the connector 52.

As illustrated in FIG. 9, an AC voltage of, for example, 100 V is applied to the power supply adapter 21 from the commercial power supply D via the primary-side cable 241, and electric power is supplied to the power supply adapter 21. The power supply adapter 21 (the main body 22) generates, if a circuit device provided therein operates, a plurality of types of DC voltages based on the electric power supplied from the commercial power supply D. For example, the power supply adapter 21 generates DC voltages of 5 V and 24 V. The two types of voltages generated by the power supply adapter 21 are applied to the connector 52 via the secondary-side cable 23. The secondary-side cable 23 includes a terminal 521 and a terminal 522, the terminal 521 supplies generated electric power having the voltage of 5 V to, for example, the CPU 91, the memory 33, and the SSD 32, whereas the terminal 522 supplies generated electric power having the voltage of 24 V to, for example, the fan 8, and a printer, a scanner or a display connected to the I/O terminal 12. The printer and the scanner may receive electric power from separate power supply.

The POS terminal 1 according to this embodiment includes: the housing 10 including the front surface portion 4 and the back surface portion 11; one or more I/O terminals 12 provided on the back surface portion 11 and configured to allow connection to an external device; the accommodation portion 5 provided in the housing 10 and configured to removably accommodate the power supply adapter 21, the power supply adapter 21 including the primary-side cable 241 supplied with electric power from the commercial power supply D and the secondary-side cable 23 configured to supply transformed electric power; the connector 52 that is provided in the accommodation portion 5 and that is connectable to the secondary-side cable 23 of the power supply adapter 21 accommodated in the accommodation portion 5; the circuit portion configured to performs various processes upon receiving supply of electric power from the power supply adapter 21 whose the secondary-side cable 23 is connected to the connector 52; and the hole 53 formed in the housing 10 and configured to lead the primary-side cable 241 of the power supply adapter 21 to the outside of the housing 10.

In the POS terminal 1 according to this embodiment, the power supply adapter 21 is accommodated in the accommodation portion 5 provided inside the housing 10, and electric power is supplied from the power supply adapter 21 via the connector 52 provided in the accommodation portion 5. Therefore, it is not necessary to provide any power supply terminal on the back surface portion 11. Therefore, a degree of freedom in design of the back surface portion 11 is improved, and various necessary I/O terminals 12 can be disposed on the back surface portion 11.

In the embodiment, the accommodation portion 5 is provided close to the front surface portion 4. Therefore, the accommodation portion 5 can be provided in a space where an HDD or DVD player mounted on a POS terminal in the related art is removed, and the power supply adapter 21 can be cooled by air flowing from the front surface portion 4 and the lid 6 due to rotation of the fan 8.

In the embodiment, the fan 8 is disposed between the accommodation portion 5 and the heat sink plate 9 that dissipates heat of the circuit portion. Therefore, by a flow of air generated by the rotation of the fan 8, heat generated from the power supply adapter 21 accommodated in the accommodation portion 5 can be released from the accommodation portion 5 to the outside of the housing 10.

The embodiment is presented by way of example only, and is not intended to limit the scope of the disclosure. The novel embodiment can be implemented in various other forms, and various omissions, replacements, and modifications can be made without departing from the gist of the disclosure. The embodiment and the modification thereof are in the scope and gist of the disclosure and are within the scope of the claims and equivalents thereof.

For example, in the embodiment, the accommodation portion 5 is provided in the vicinity of the front surface portion 4 of the housing 10. However, the disclosure is not limited thereto, and the accommodation portion 5 may not be in the vicinity of the front surface portion 4 as long as there is a path for a flow of air generated by the rotation of the fan 8.

In the embodiment, the power supply adapter 21 converts the AC voltage supplied from the commercial power supply D into a plurality of types of DC voltages. However, the power supply adapter 21 is not limited thereto, and may also convert the AC voltage supplied from the commercial power supply D into one type (for example, 5 V only) of DC voltage.

In the embodiment, the POS terminal 1 is described as an example of the information processing apparatus. However, the information processing apparatus is not limited thereto, and may also be, for example, a personal computer capable of accommodating the power supply adapter.

What is claimed is:

1. An information processing apparatus, comprising:
a housing comprising a front surface portion and a back surface portion;
one or more input and output terminals provided on the back surface portion and configured to allow connection to an external device;
an accommodation portion provided in the housing and configured to removably accommodate a power supply adapter, the power supply adapter comprising a primary-side cable connectable to a commercial power supply and a secondary-side cable configured to supply electric power;
a connector provided in the accommodation portion and connectable to the secondary-side cable of the power supply adapter accommodated in the accommodation portion;
a circuit configured to perform various processes upon receiving supply of electric power from the power supply adapter whose secondary-side cable is connected to the connector;
a hole formed in the housing and configured to lead the primary-side cable of the power supply adapter to outside of the housing; and
a fan configured to generate airflow between the accommodation portion and a heat sink plate configured to dissipate heat generated from the circuit, wherein
the accommodation portion is provided in the housing on a front surface portion side, and
the power supply adapter accommodated in the accommodation portion and the circuit are cooled by the airflow generated by the fan.

2. The information processing apparatus according to claim 1, wherein
the hole is formed at a position other than in the back surface portion.

3. The information processing apparatus according to claim 1, wherein
the housing comprises a lid configured to open and close the accommodation portion, an air hole configured to introduce air into inside of the housing is formed in the lid, and the air introduced from the air hole causes the fan to generate a flow of the air.

4. The information processing apparatus according to claim 3, comprising a plurality of air holes configured to introduce air into inside of the housing.

5. The information processing apparatus according to claim 1, wherein
the housing comprises, in the front surface portion, an air hole configured to introduce air into inside of the housing, and the air introduced from the air hole causes the fan to generate a flow of the air.

6. The information processing apparatus according to claim 5, comprising a plurality of air holes configured to introduce air into inside of the housing.

7. The information processing apparatus according to claim 1, comprising two or more input and output terminals provided on the back surface portion.

8. The information processing apparatus according to claim 1, comprising three or more input and output terminals provided on the back surface portion.

9. A POS terminal, comprising:
a settlement component;
a registration component;
a housing comprising a front surface portion and a back surface portion;
one or more input and output terminals provided on the back surface portion and configured to allow connection to an external device;
an accommodation portion provided in the housing and configured to removably accommodate a power supply adapter, the power supply adapter comprising a primary-side cable connectable to a commercial power supply and a secondary-side cable configured to supply electric power;
a connector provided in the accommodation portion and connectable to the secondary-side cable of the power supply adapter accommodated in the accommodation portion;
a circuit configured to perform various processes upon receiving supply of electric power from the power supply adapter whose secondary-side cable is connected to the connector;
a hole formed in the housing and configured to lead the primary-side cable of the power supply adapter to outside of the housing; and
a fan configured to generate airflow between the accommodation portion and a heat sink plate configured to dissipate heat generated from the circuit, wherein
the accommodation portion is provided in the housing on a front surface portion side, and
the power supply adapter accommodated in the accommodation portion and the circuit are cooled by the airflow generated by the fan.

10. The POS terminal according to claim 9, wherein
the hole is formed at a position other than in the back surface portion.

11. The POS terminal according to claim 9, wherein
the housing comprises a lid configured to open and close the accommodation portion, an air hole configured to introduce air into inside of the housing is formed in the lid, and the air introduced from the air hole causes the fan to generate a flow of the air.

12. The POS terminal according to claim 11, comprising a plurality of air holes configured to introduce air into inside of the housing.

13. The POS terminal according to claim 9, wherein
the housing comprises, in the front surface portion, an air hole configured to introduce air into inside of the housing, and the air introduced from the air hole causes the fan to generate a flow of the air.

14. The POS terminal according to claim 13, comprising a plurality of air holes configured to introduce air into inside of the housing.

15. The POS terminal according to claim 9, comprising two or more input and output terminals provided on the back surface portion.

16. The POS terminal according to claim 9, comprising three or more input and output terminals provided on the back surface portion.

\* \* \* \* \*